(12) United States Patent
Kobayashi et al.

(10) Patent No.: US 7,744,780 B2
(45) Date of Patent: Jun. 29, 2010

(54) YTTRIUM OXIDE MATERIAL, MEMBER FOR USE IN SEMICONDUCTOR MANUFACTURING APPARATUS, AND METHOD FOR PRODUCING YTTRIUM OXIDE MATERIAL

(75) Inventors: Yoshimasa Kobayashi, Nagoya (JP); Yuji Katsuda, Tsushima (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 0 days.

(21) Appl. No.: 12/369,106

(22) Filed: Feb. 11, 2009

(65) Prior Publication Data
US 2009/0200523 A1 Aug. 13, 2009

(30) Foreign Application Priority Data
Feb. 13, 2008 (JP) .............................. 2008-031244

(51) Int. Cl.
*H01B 1/08* (2006.01)
*C04B 35/505* (2006.01)
(52) U.S. Cl. .................. 252/516; 252/520.5; 252/521.1
(58) Field of Classification Search ................ 252/516, 252/520.5, 521.1; 501/96.5
See application file for complete search history.

(56) References Cited

U.S. PATENT DOCUMENTS

| 4,501,723 A * | 2/1985 | Ezis et al. ................... 423/263 |
| 7,375,046 B2 * | 5/2008 | Aihara et al. ................ 501/152 |
| 2008/0226894 A1 * | 9/2008 | Kobayashi et al. ........ 428/312.8 |

FOREIGN PATENT DOCUMENTS

| JP | 11-278935 | 10/1999 |
| JP | 2006-069843 | 3/2006 |
| JP | 2006-225185 | 8/2006 |

* cited by examiner

*Primary Examiner*—Mark Kopec
(74) *Attorney, Agent, or Firm*—Burr & Brown

(57) ABSTRACT

A substrate of an electrostatic chuck, which is a member for use in a semiconductor manufacturing apparatus, is formed of an yttrium oxide material that contains yttrium oxide ($Y_2O_3$), silicon carbide (SiC), and a compound that contains a rare-earth element (RE), Si, O, and N. The yttrium oxide material contains $RE_8Si_4N_4O_{14}$ as a compound that contains a rare-earth element (RE), Si, O, and N, wherein RE may be La or Y. $Y_8Si_4N_4O_{14}$ is produced during a sintering step of a raw material that contains the main component $Y_2O_3$ and an accessory component $Si_3N_4$. $Y_8Si_4N_4O_{14}$ and SiC in the yttrium oxide material improve mechanical strength and volume resistivity.

13 Claims, 4 Drawing Sheets

YTTRIUM OXIDE MATERIAL, MEMBER FOR USE IN SEMICONDUCTOR MANUFACTURING APPARATUS, AND METHOD FOR PRODUCING YTTRIUM OXIDE MATERIAL

The present application claims priority from Japanese Patent Application No. 2008-031244 filed on Feb. 13, 2008, the entire contents of which are incorporated herein by reference.

BACKGROUND OF THE INVENTION

1. Field of the Invention

The present invention relates to an yttrium oxide material, a member for use in a semiconductor manufacturing apparatus, and a method for producing the yttrium oxide material.

2. Description of the Related Art

An yttrium oxide material that contains 2% to 30% by weight of silicon carbide having a particle size of 0.03 to 5 μm has been proposed as a ceramic member for use in a semiconductor manufacturing apparatus. The yttrium oxide material has high electrical conductivity and exhibits high corrosion resistance and durability in a halogen plasma gas (see, for example, Japanese Unexamined Patent Application Publication No. 2006-69843).

Although the yttrium oxide material described in Japanese Unexamined Patent Application Publication No. 2006-69843 specifically contains silicon carbide to increase electrical conductivity, corrosion resistance, and durability in semiconductor manufacturing, these characteristics are still insufficient. Thus, there is a demand for further improvement in characteristics, including mechanical strength. While the yttrium oxide material described in Japanese Unexamined Patent Application Publication No. 2006-69843 has an increased electrical conductivity, there is another demand for yttrium oxide materials that have low electrical conductivity or high volume resistivity.

In view of the situations described above, it is an object of the present invention to provide an yttrium oxide material that has high mechanical strength, a member for use in a semiconductor manufacturing apparatus, and a method for producing the yttrium oxide material. It is another object of the present invention to provide an yttrium oxide material that has high volume resistivity, a member for use in a semiconductor manufacturing apparatus, and a method for producing the yttrium oxide material.

SUMMARY OF THE INVENTION

As a result of diligent research to achieve the above-mentioned objects, the present inventors completed the present invention by finding that an yttrium oxide material that contains silicon carbide (SiC) and a particular component can have high mechanical strength.

An yttrium oxide material according to one aspect of the present invention contains yttrium oxide ($Y_2O_3$), SiC, and a compound that contains a rare-earth element (hereinafter referred to as RE), Si, O, and N.

A method for producing an yttrium oxide material according to another aspect of the present invention includes the step of firing a mixture of $Y_2O_3$, SiC, and inorganic particles at a temperature in the range of 1500° C. to 1850° C. The inorganic particles are to be converted into a compound that contains RE, Si, O, and N.

The yttrium oxide material, a member formed of the yttrium oxide material for use in a semiconductor manufacturing apparatus, and a method for producing the yttrium oxide material can provide high mechanical strength and volume resistivity. While the reason for the high mechanical strength and volume resistivity is not clear, it is assumed as described below. Since SiC may increase the strength of a material but may decrease sinterability, forming a defective portion, SiC rarely increases the strength of a fired product. However, a compound that contains RE, Si, O, and N, which is formed from RE and other components, such as Si and N, can improve the sinterability, thus compensating for the defective portion caused by SiC and increasing the strength. The reason for the high volume resistivity is assumed as described below. In an yttrium oxide material that contains SiC, SiC particles may be joined to each other, exhibiting electrical conductivity. Furthermore, firing in a reducing atmosphere may generate an oxygen deficiency in an yttrium oxide phase, exhibiting electrical conductivity. However, a compound that contains RE, Si, O, and N, which is formed from RE and other components, such as Si and N, can prevent the growth of yttrium oxide particles during the firing step by a pinning effect. This decreases the frequency of contacts between the SiC particles at the boundaries of yttrium oxide particles, thus reducing connections between the SiC particles. In addition, the compound that contains RE, Si, O, and N is more reducible than yttrium oxide and therefore prevents yttrium oxide from being reduced.

BRIEF DESCRIPTION OF THE DRAWINGS

FIG. 1 illustrates an electrostatic chuck 20 according to an embodiment of the present invention.

DETAILED DESCRIPTION OF THE INVENTION

Figure 1A:
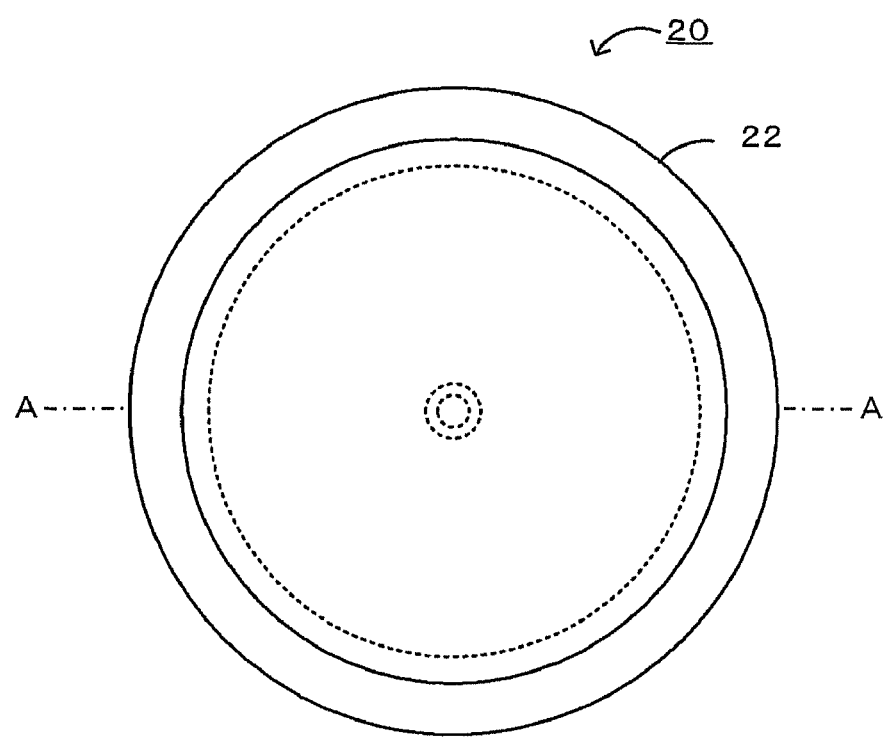
FIG. 1A is a plan view of the electrostatic chuck 20.
Figure 1B:
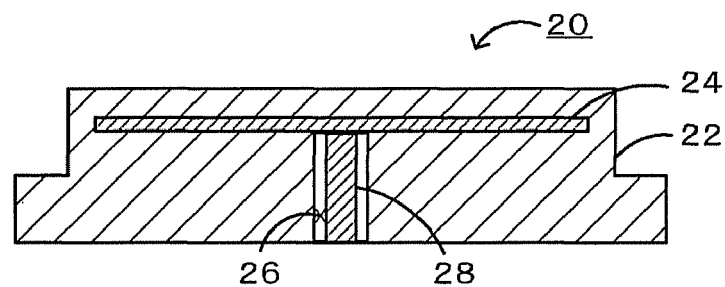
FIG. 1B is a cross-sectional view taken along the line A-A in FIG. 1A.

Preferred embodiments of the present invention will be described below with reference to the accompanying drawings. FIG. 1 illustrates an electrostatic chuck 20 according to an embodiment of the present invention. FIG. 1A is a plan view of the electrostatic chuck 20. FIG. 1B is a cross-sectional view taken along the line A-A in FIG. 1A. The electrostatic chuck 20 according to the present embodiment is a member for use in a semiconductor manufacturing apparatus. The electrostatic chuck 20 holds a silicon wafer thereon by adsorption. As illustrated in FIG. 1B, the electrostatic chuck 20 includes a discoidal substrate 22, an electrostatic electrode 24 disposed within the substrate 22, and a terminal 28. An upper part of the substrate 22 has a diameter smaller than the diameter of a lower part. The electrostatic electrode 24 generates electrostatic adsorption force. The terminal 28 is disposed within a hole 26, which extends downward from the center of the electrostatic electrode 24, and is connected to the electrostatic electrode 24.

The substrate 22 is formed of an yttrium oxide material that contains $Y_2O_3$, SiC, and a compound that contains RE, Si, O, and N (also referred to as a rare-earth compound). The rare-earth compound in the yttrium oxide material of the substrate 22 may be $RE_8Si_4N_4O_{14}$. RE is preferably La or Y. The yttrium oxide material contains $Y_8Si_4N_4O_{14}$ (that is, RE is Y). $Y_8Si_4N_4O_{14}$ may be produced during a sintering step of a raw material that contains the main component $Y_2O_3$ and an accessory component $Si_3N_4$ or SiC, or $SiO_2$ formed on the surface of $Si_3N_4$ or SiC powder. The yttrium oxide material may contain $RE_2Si_3O_3N_4$ as a rare-earth compound. Preferably, $RE_2Si_3O_3N_4$ is $Y_2Si_3O_3N_4$ or $La_2Si_3O_3N_4$.

SiC in the yttrium oxide material preferably has an average particle size of 4 μm or less, more preferably 2 μm or less. Even when a corrosive gas corrodes SiC in semiconductor manufacturing, SiC having an average particle size of 4 μm or less does not significantly affect the smoothness of a surface on which a silicon wafer is placed. Preferably, SiC has an average particle size of at least 0.5 μm. SiC having an average particle size of at least 0.5 μm can further increase the mechanical strength of the yttrium oxide material. The average particle size of SiC is determined with a scanning electron microscope (SEM) at a magnification suitable to observe SiC particles (for example, a magnification in the range of 2000 to 10000). The average particle size of SiC is defined herein by the average minor axis length of SiC particles thus observed.

The yttrium oxide material may further contain fluorine (F). Fluorine may be contained in any form, including $REF_3$, REOF, $MgF_2$, $CaF_2$, $AlF_3$, and solid solution in yttrium oxide particles. More specifically, fluorine may be contained as $YF_3$, YOF, $MgF_2$, $CaF_2$, $AlF_3$, or solid solution in yttrium oxide particles. Fluorine can improve sinterability and therefore increase the mechanical strength of a sintered product. Fluorine can also advantageously decrease the volume change when a halogen corrosive gas, such as $NF_3$, reacts with yttrium oxide to yield a reaction product, such as $YF_3$, and prevent the formation of particles of the reaction product.

The yttrium oxide material preferably has a four-point bending strength of at least 250 MPa, more preferably at least 270 MPa, and still more preferably at least 300 MPa. An yttrium oxide material having a four-point bending strength of at least 250 MPa is suitable as a member for use in a semiconductor manufacturing apparatus. The yttrium oxide material preferably has a fracture toughness of at least 1.5 MPa·m$^{1/2}$, more preferably at least 1.7 MPa·m$^{1/2}$, and still more preferably at least 1.9 MPa·m$^{1/2}$. An yttrium oxide material having a fracture toughness of at least 1.5 MPa·m$^{1/2}$ is suitable as a member for use in a semiconductor manufacturing apparatus. The four-point bending strength is measured in accordance with JIS R1601. The fracture toughness is determined by an indentation fracture (IF) method (at a load of 9.8 N) in accordance with JIS R1607.

The yttrium oxide material preferably has a volume resistivity of at least $1 \times 10^{15}$ Ωcm, more preferably at least $1 \times 10^{16}$ Ωcm, at 20° C. An yttrium oxide material having a volume resistivity of at least $1 \times 10^{15}$ Ωcm is suitable as a member for use in a semiconductor manufacturing apparatus.

The yttrium oxide material preferably has a density in the range of 4.7 to 5.0 g/cm$^3$, more preferably in the range of 4.8 to 5.0 g/cm$^3$, although the density depends on elements contained in the yttrium oxide material. The yttrium oxide material preferably has a percentage of open pores of 5% or less, more preferably 0.5% or less. An yttrium oxide material having a percentage of open pores of 5% or less can have high mechanical strength. The density and the percentage of open pores are determined by Archimedes' principle using a pure water medium in accordance with JIS R1634.

A method for manufacturing the electrostatic chuck 20 will be described below. A method for manufacturing the electrostatic chuck 20 may include (1) a raw material preparation step and (2) a forming and firing step.

(1) Raw Material Preparation Step

In the raw material preparation step, a mixture of $Y_2O_3$, SiC, and inorganic particles, which are to be converted into a rare-earth compound, is added to a solvent to prepare a raw material powder. The inorganic particles may be formed of $RE_2O_3$, $Si_3N_4$, or $SiO_2$. RE is preferably Y or La. $SiO_2$ may be a product formed by oxidation on the surface of a $Si_3N_4$ or SiC powder. Preferably, the raw material powder of the yttrium oxide material contains at least 80% by volume of $Y_2O_3$. The raw material powder preferably contains 1.0% to 10% by volume, more preferably 3.0% to 7.5% by volume, of $Si_3N_4$. The raw material powder preferably contains 1.0% to 20% by volume, more preferably 5.0% to 13% by volume, still more preferably 10% by volume, of SiC. In these ranges, the yttrium oxide material can have excellent characteristics, such as high mechanical strength and fracture toughness. Preferably, the raw material powder of the yttrium oxide material contains fluorine. Fluorine can lower the firing temperature, and therefore decrease the size of particles constituting a fired product, improve the mechanical strength, and decrease the energy consumed by firing. Fluorine can also prevent the growth of yttrium oxide particles and thereby prevent connections between SiC particles. In addition, fluorine can prevent yttrium oxide from being reduced. Thus, fluorine can increase the volume resistivity of the yttrium oxide material. Preferably, fluorine is added to the raw material powder in the form of $REF_3$, $MgF_2$, $CaF_2$, or $AlF_3$. More preferably, $REF_3$ is $YF_3$ or $LaF_3$. The raw material powder preferably contains 0% to 5% by volume, more preferably 0.5% to 3% by volume, of at least one compound selected from the group consisting of $REF_3$, $MgF_2$, $CaF_2$, and $AlF_3$. 0.5% to 3% by volume of the compound can improve the mechanical strength of the yttrium oxide material. $Y_2O_3$, SiC, and the inorganic particles, which are to be converted into a rare-earth compound, may be mixed with a solvent in a ball mill. A solvent may be appropriately added to the mixture to form slurry. Preferably, the solvent is an organic solvent, for example, an alcohol, such as isopropyl alcohol. The slurry may be dried in an inert atmosphere. After drying, the resulting powder may be sieved to prepare a green powder.

(2) Forming and Firing Step

In this step, the green powder is formed into a predetermined shape and is fired. The forming and firing step may be performed by pressureless sintering or hot-press firing. In the pressureless sintering, a compact formed, for example, by molding using a metal mold, cold isostatic pressing (CIP), or slip casting is fired at atmospheric pressure. In the hot-press firing, a powder is fired while being pressed into a predetermined shape. The hot-press firing is preferred. In the hot-press firing, firing is preferably performed in an inert atmosphere. Preferably, the inert atmosphere may be a nitrogen or argon gas atmosphere. In the hot-press firing, the pressure is preferably selected in accordance with the size of a compact and, for example, ranges from 50 to 200 kg/cm$^2$. The firing temperature preferably ranges from 1300° C. to 1900° C., more preferably from 1500° C. to 1850° C., and still more preferably from 1600° C. to 1800° C. At a firing temperature of at least 1500° C., the density can be increased. At a firing temperature of 1850° C. or less, the size of particles constituting a fired product can be decreased, resulting in high mechanical strength and low energy consumption in firing. Furthermore, this temperature range results in a decrease in growth of yttrium oxide particles, thus decreasing connections between SiC particles, and results in prevention of the reduction of yttrium oxide. Thus, the yttrium oxide material can have high volume resistivity in this temperature range. In forming and firing of the electrostatic chuck 20, the substrate 22 and the electrostatic electrode 24 may be formed and fired in a single piece or separately. For example, referring to FIG. 1, a lower part having a hole 26 of the substrate 22, the electrostatic electrode 24, and an upper part of the substrate 22 are formed in this order before firing. The electrostatic electrode 24 is formed using a previously prepared paste that contains an electrode component (for example, Pt or Au). In the preparation of the paste, preferably, ceramic powders are blended so that the electrostatic electrode 24 has substantially the same thermal expansion coefficient as the substrate 22. A compact may be formed only of an yttrium oxide material without the electrostatic electrode 24. In the forming and firing step, raw material powders, $Y_2O_3$, $Si_3N_4$, or SiC, or $SiO_2$ on the surface of $Si_3N_4$ or SiC powder, react with each other to yield rare-earth compounds, such as $Y_8Si_4N_4O_{14}$ and $Y_2Si_3O_3N_4$, in the yttrium oxide material. Thus, the electrostatic chuck 20 formed of an yttrium oxide material can be produced.

The electrostatic chuck 20 according to the present embodiment is formed of an yttrium oxide material that contains the main component $Y_2O_3$, SiC, and a rare-earth compound, such as $Y_8Si_4N_4O_{14}$ or $Y_2Si_3O_3N_4$, and has high mechanical strength, fracture toughness, and volume resistivity. Because SiC has an average particle size of 4 μm or less after firing, even when a corrosive gas corrodes SiC, the smoothness of a surface on which a silicon wafer is placed can be maintained.

The present invention is not limited to the above-mentioned embodiment and can be implemented in various embodiments within the scope of the present invention.

For example, while the member of an yttrium oxide material is an electrostatic chuck in the above-mentioned embodiment, the member may be another member for use in semiconductor manufacturing, for example, a dome-shaped chamber member for housing the electrostatic chuck, a susceptor including a heater, a dummy focus ring disposed on the periphery of the electrostatic chuck, a clamping ring for fixing a silicon wafer, or a heater for heating a silicon wafer. The member of an yttrium oxide material is not limited to members for use in semiconductor manufacturing. For example, a member that utilizes the corrosion resistance of yttrium oxide may be used in any field.

While the rare-earth compound is $Y_8Si_4N_4O_{14}$ or $Y_2Si_3O_3N_4$ produced from $Y_2O_3$ and $Si_3N_4$ in the above-mentioned embodiment, the rare-earth compound may contain La or another rare-earth element, such as Yb.

EXAMPLES

Actual manufacture of an yttrium oxide material will be described below as examples.

Example 1

A raw powder that contains 89% by volume of yttrium oxide ($Y_2O_3$, Shin-Etsu Chemical Co., Ltd., UUHP grade), 10% by volume of silicon carbide (SiC, Ibiden Co., Ltd.), 1% by volume of silicon nitride ($Si_3N_4$, Ube Industries, Ltd., E10), and 0% by volume of yttrium fluoride ($YF_3$, Kojundo Chemical Laboratory Co., Ltd.) ($Y_2O_3$:SiC:$Si_3N_4$:$YF_3$=89:10:1:0) in an isopropyl alcohol (IPA) solvent was wet-blended in a ball mill using $ZrO_2$ balls for 24 hours to produce slurry. The slurry was passed through a sieve and was then dried at 110° C. in a nitrogen atmosphere for 16 hours to produce a green powder. After the green powder was passed through a sieve, 80 g of green powder was pressed at 200 kg/cm² to form a discoid compact having a diameter of 50 mm. The compact was subjected to hot-press firing in an argon gas atmosphere at 1700° C. and at a pressure of 200 kg/cm² for two hours to produce an yttrium oxide material according to Example 1.

Examples 2 to 11

An yttrium oxide material according to Example 2 was produced in the same manner as Example 1, except that a raw powder having the same composition as the raw powder in Example 1 was subjected to hot-press firing at 1800° C. for two hours. Yttrium oxide materials according to Examples 3 to 11 were produced in the same manner as Example 1, except that the ratios of $Y_2O_3$, SiC, and $Si_3N_4$ were 87:10:3 for Examples 3 and 4, 85:10:5 for Examples 5, 6, and 7, 82.5:10:7.5 for Examples 8 and 9, 87.5:7.5:5 for Example 10, and 90:5:5 for Example 11, and that shot-press firing was performed at 1700° C. for two hours in Examples 3, 5, and 8, 1800° C. for two hours in Examples 4, 6, 9, 10, and 11, and 1850° C. for two hours in Example 7.

Examples 12 to 20

Yttrium oxide materials according to Examples 12 to 20 were produced in the same manner as Example 1, except that the ratios of $Y_2O_3$, SiC, $Si_3N_4$, and $YF_3$ were 88:10:3:1 for Example 12, 86:10:3:1 for Examples 13 to 16, 84:10:5:1 for Example 17, 81.5:10:7.5:1 for Example 18, 86.5:7.5:5:1 for Example 19, and 89:5:5:1 for Example 20, and that shot-press firing was performed at 1600° C. for two hours in Example 13, 1700° C. for two hours in Example 14, 1800° C. for two hours in Examples 12, 15, and 17 to 20, and 1850° C. for two hours in Example 16.

Example 21

An yttrium oxide material according to Example 21 was produced in the same manner as Example 1, except that the ratio of $Y_2O_3$, SiC, $Si_3N_4$, and $YF_3$ was 84:10:3:3 and that hot-press firing was performed at 1550° C. for two hours.

Examples 22 to 31

Yttrium oxide materials according to Example 22 to 31 were produced in the same manner as Example 1, except that the ratios of $Y_2O_3$, SiC, $Si_3N_4$, and $YF_3$ were 100:0:0:0 for Examples 22 to 24, 90:10:0:0 for Examples 25 to 27, 89:10:0:1 for Examples 28 to 30, and 91.5:0:7.5:1 for Example 31, and that shot-press firing was performed at 1600° C. for two hours in Examples 22, 25, and 28, 1700° C. for two hours in Examples 23, 26, and 29, and 1800° C. for two hours in Examples 24, 27, 30, and 31.

Examples 32 to 37

An yttrium oxide material according to Example 32 was produced in the same manner as Example 1, except that the ratio of $Y_2O_3$, SiC, $Si_3N_4$, and $CaF_2$ was 86:10:3:1 and that hot-press firing was performed at 1650° C. for two hours. An yttrium oxide material according to Example 33 was produced in the same manner as Example 1, except that the ratio of $Y_2O_3$, SiC, $Si_3N_4$, and $CaF_2$ was 81.8:13:3.9:1.3 and that hot-press firing was performed at 1650° C. for two hours. An yttrium oxide material according to Example 34 was produced in the same manner as Example 1, except that the ratio of $Y_2O_3$, SiC, $Si_3N_4$, and $CaF_2$ was 81.8:13:3.9:1.3 and that hot-press firing was performed at 1700° C. for two hours. An yttrium oxide material according to Example 35 was produced in the same manner as Example 1, except that the ratio of $Y_2O_3$, SiC, $Si_3N_4$, and $MgF_2$ was 86:10:3:1 and that hot-press firing was performed at 1650° C. for two hours. An yttrium oxide material according to Example 36 was produced in the same manner as Example 1, except that the ratio of $Y_2O_3$, SiC, $Si_3N_4$, and $MgF_2$ was 86:10:3:1 and that hot-press firing was performed at 1700° C. for two hours. An yttrium oxide material according to Example 37 was produced in the same manner as Example 1, except that the ratio of $Y_2O_3$, SiC, $Si_3N_4$, and $AlF_3$ was 86:10:3:1 and that hot-press firing was performed at 1650° C. for two hours.

Evaluation of Constituent Phase

The X-ray diffraction pattern of the yttrium oxide materials according to Examples 1 to 37 was measured with an X-ray diffractometer (rotating anode X-ray diffractometer (RINT, manufactured by Rigaku Co.), CuKα line source, 50 kV, 300 mA, 2θ=10° to 70°). The crystal phase was identified on the basis of the X-ray diffraction pattern.

Measurement of SiC Particle Size

The average particle size of SiC in the yttrium oxide materials according to Examples 1 to 37 was determined using a SEM (XL30, manufactured by Royal Philips Electronics). The average particle size of SiC was defined by the average minor axis length of SiC particles having a size of at least 0.5 μm, because the size of SiC particles less than 0.5 μm could not be determined precisely.

Strength Measurement

The four-point bending strength of the yttrium oxide materials according to Examples 1 to 37 was measured with a strength tester (S500C, manufactured by Shimadzu Co.) in accordance with JIS R1601.

Measurement of Fracture Toughness

The fracture toughness of the yttrium oxide materials according to Examples 1 to 37 was measured with a strength tester (AVK, manufactured by Akashi Co.) by an IF method (at a load of 9.8 N) in accordance with JIS R1607.

Measurement of Density and Percentage of Open Pores

The density and the percentage of open pores of the yttrium oxide materials according to Examples 1 to 37 were determined by Archimedes' principle using a pure water medium in accordance with JIS R1634. The density was defined by the bulk density.

Measurement of Volume Resistivity

The volume resistivity of the yttrium oxide materials according to Examples 1 to 37 was measured in the atmosphere at room temperature in accordance with JIS C2141. A test specimen was 50 mm in diameter and 1 mm in thickness. A main electrode having a diameter of 20 mm, a guard electrode having an inner diameter of 30 mm and an outer diameter of 40 mm, and an application electrode having a diameter of 40 mm were formed using a silver paste. The electric current was read one minute after application of a voltage in the range of 0.1 to 500 V/mm to calculate the volume resistivity.

Chemical Analysis

The fluorine content in the yttrium oxide materials according to Examples 12 to 20 and 28 to 37 was determined by a method for quantifying fluorine described in JIS R1675, in which pyrohydrolysed solution was subjected to ion chromatography. The analysis showed that fluorine in the raw material powder remained in each of the fired products according to Examples 1 to 37.

Measurement Results

Figure 2:
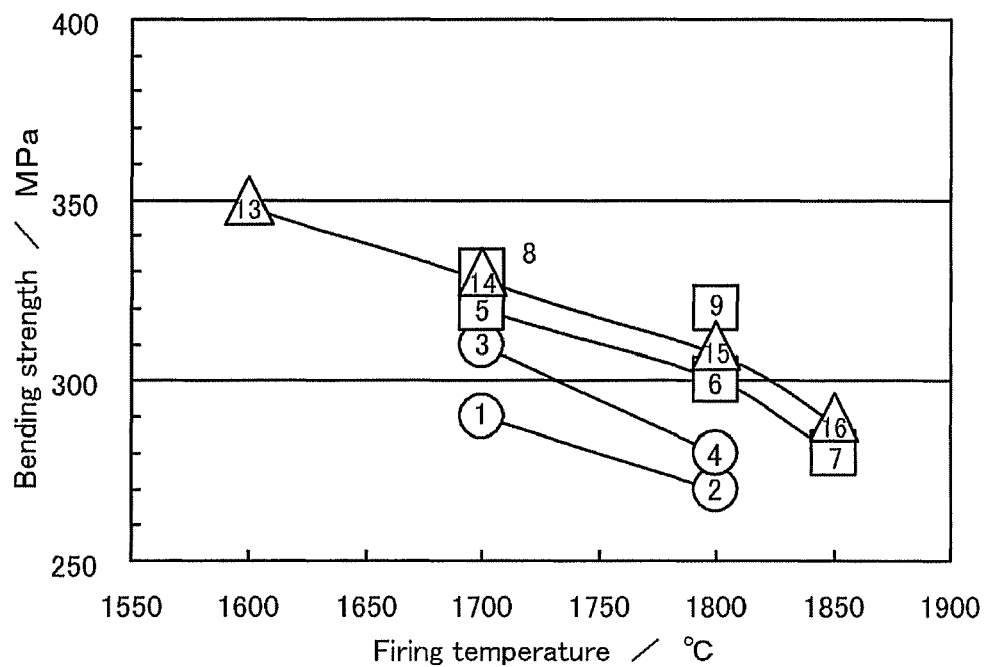
FIG. 2 is a graph showing the bending strength of Examples 1 to 9 and 13 to 16 as a function of firing temperature.
Figure 3:
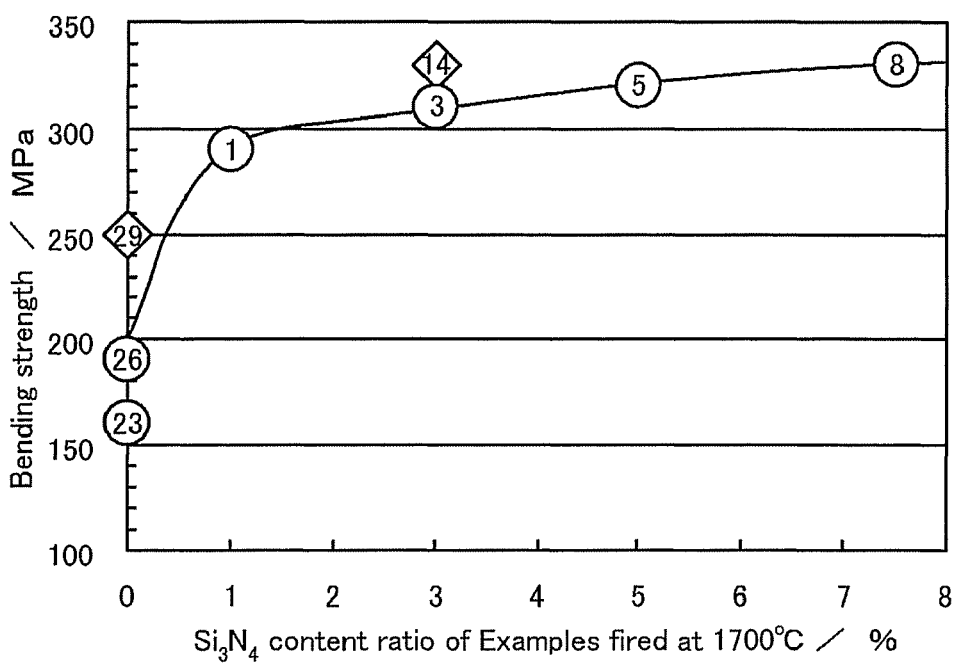
FIG. 3 is a graph showing the bending strength of Examples fired at 1700° C. as a function of $Si_3N_4$ content.
Figure 4:
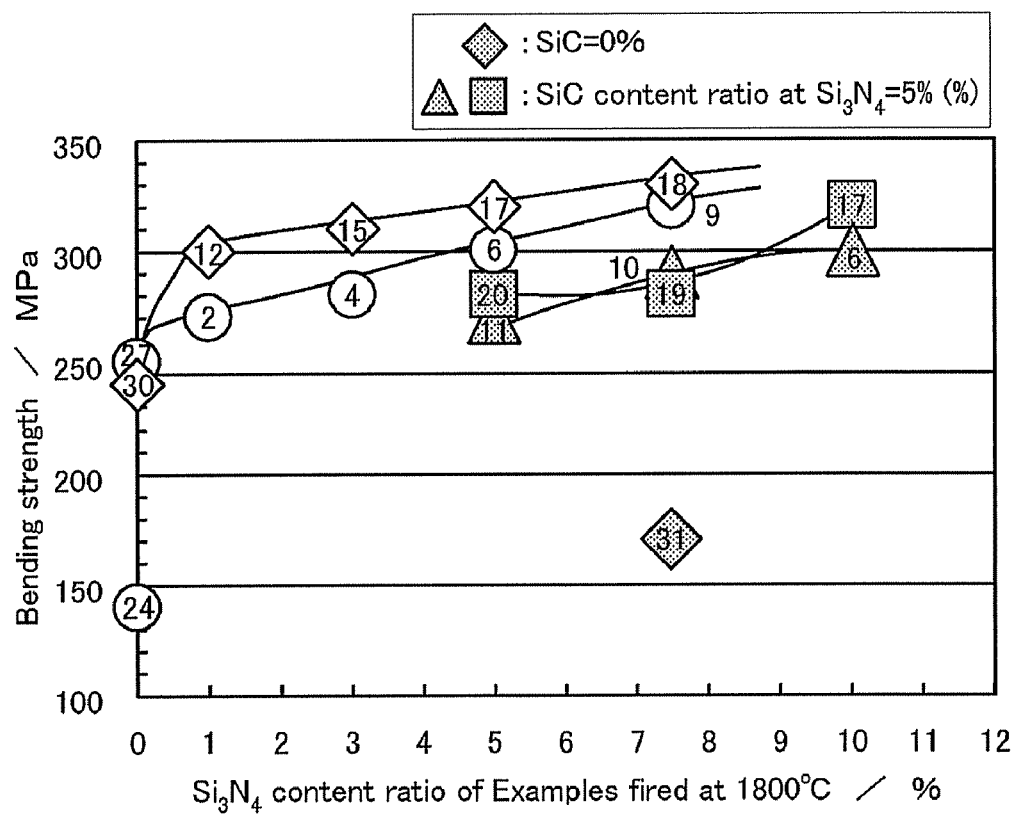
FIG. 4 is a graph showing the bending strength of Examples fired at 1800° C. as a function of $Si_3N_4$ content.
Figure 5A:
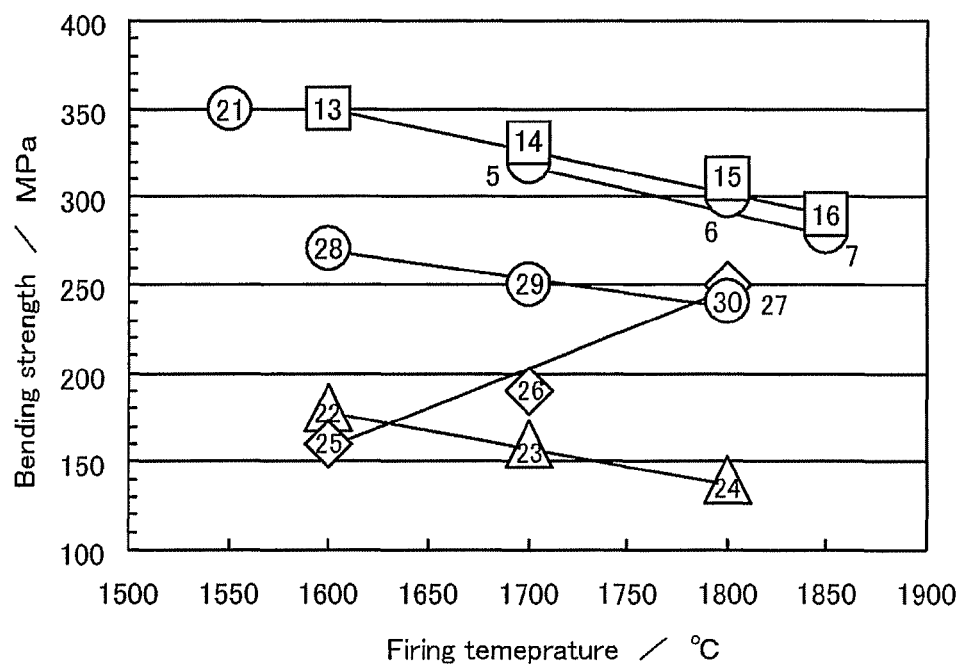
FIGS. 5A and 5B are graphs showing the bending strength of Examples 5 to 7, 13 to 16, and 21 to 30 as a function of firing temperature.
Figure 5B:
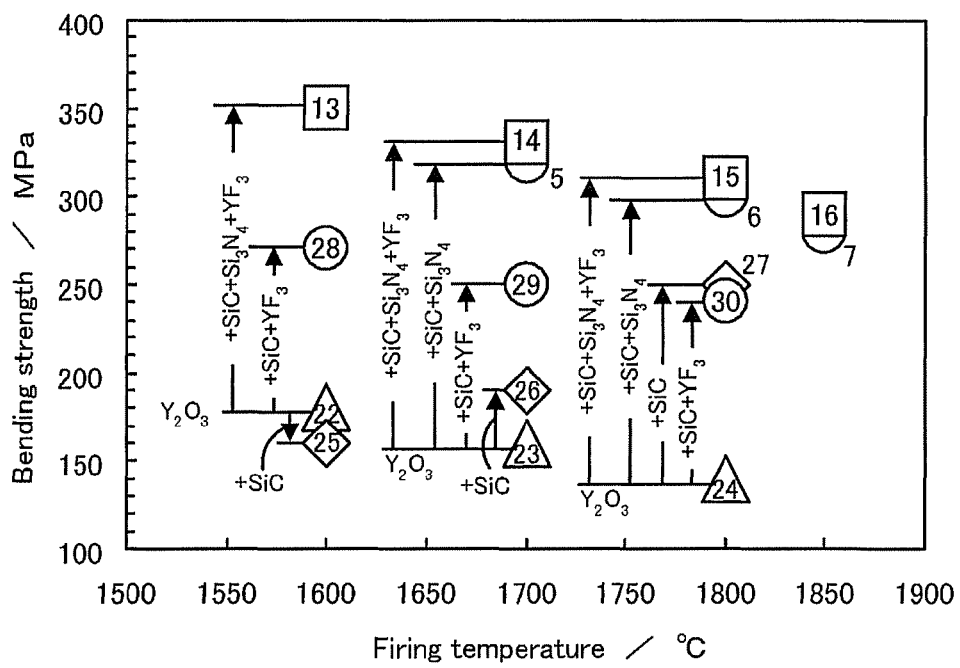

Table 1 shows the measurements for Examples 1 to 31. Table 2 shows the measurements for Examples 32 to 37. FIG. 2 is a graph showing the bending strength of Examples 1 to 9 and 13 to 16 as a function of firing temperature. FIG. 3 is a graph showing the bending strength of Examples fired at 1700° C. as a function of $Si_3N_4$ content. FIG. 4 is a graph showing the bending strength of Examples fired at 1800° C. as a function of $Si_3N_4$ content. FIGS. 5A and 5B are graphs showing the bending strength of Examples 5 to 7, 13 to 16, and 21 to 30 as a function of firing temperature. FIGS. 2 to 4 show data for Examples in which the $Si_3N_4$ content and the firing temperature were examined. FIGS. 5A and 5B show data for Examples in which the effect of additives SiC, $Si_3N_4$, and $YF_3$ and the firing temperature were examined. FIG. 4 also shows data for Examples in which the bending strength was examined as a function of SiC content, as represented by shaded symbols. In FIGS. 2 to 5, for the sake of clarity, Examples of the same composition are represented by the same symbols. The number of Example is written within the symbols. FIGS. 2 and 5 show that, when the composition is the same, the bending strength decreases with increasing firing temperature. FIGS. 3 and 4 show that the bending strength increases with increasing $Si_3N_4$ content up to 7.5% by volume. Likewise, the bending strength increases with increasing SiC content up to 10% by volume. FIG. 5B shows that the addition of SiC to $Y_2O_3$ (triangle) slightly increases the bending strength, and the addition of SiC and $Si_3N_4$ increases the bending strength more than the addition of SiC and $YF_3$. FIG. 5B also shows that the addition of $YF_3$ to SiC and $Si_3N_4$ further increases the bending strength. In particular, high bending strength was achieved at a firing temperature in the range of 1600° C. to 1800° C., particularly in the range of 1600° C. to 1700° C. The yttrium oxide material according to Example 21, which contained 3% by volume of $YF_3$, had a high bending strength at a firing temperature as low as 1550° C. The fracture toughness had the same tendency as the bending strength (see Table 1). The volume resistivity was as high as $10^{16}$ Ωcm or more, except for Examples 23 and 24. Examples 1 to 21 and 32 to 37, which contained SiC and $Y_8Si_4N_4O_{14}$, were found to have high bending strength, fracture toughness, and volume resistivity. Fluorine compounds $CaF_2$, $MgF_2$, and $AlF_3$ were found to give high bending strength, fracture toughness, and volume resistivity at a relatively low firing temperature (1650° C. to 1700° C.). An Example that contained La as RE was also examined and was found to have high bending strength, fracture toughness, and volume resistivity, as in Examples that contained Y as RE.

TABLE 1

| Sample | Composition (Vol %) Y$_2$O$_3$ | SiC | Si$_3$N$_4$ | YF$_3$ | Firing temperature °C. | Constituent phases | Average SiC particle diameter μm | Density g/cm$^3$ | Open pores % | Strength MPa | Fracture toughness MPA·m$^{1/2}$ | Volume resistivity Ω cm |
|---|---|---|---|---|---|---|---|---|---|---|---|---|
| Example 1 | 89 | 10 | 1 | 0 | 1700 | Y$_2$O$_3$, SiC, Y$_8$Si$_4$N$_4$O$_{14}$ | 1.2 | 4.83 | 0.0 | 290 | 1.7 | 10$^{16}$ |
| Example 2 | 89 | 10 | 1 | 0 | 1800 | Y$_2$O$_3$, SiC, Y$_8$Si$_4$N$_4$O$_{14}$ | 1.2 | 4.83 | 0.0 | 270 | 1.7 | 10$^{16}$ |
| Example 3 | 87 | 10 | 3 | 0 | 1700 | Y$_2$O$_3$, SiC, Y$_8$Si$_4$N$_4$O$_{14}$ | 1.4 | 4.79 | 0.0 | 310 | 1.8 | 10$^{16}$ |
| Example 4 | 87 | 10 | 3 | 0 | 1800 | Y$_2$O$_3$, SiC, Y$_8$Si$_4$N$_4$O$_{14}$ | 1.4 | 4.79 | 0.0 | 280 | 1.8 | 10$^{16}$ |
| Example 5 | 85 | 10 | 5 | 0 | 1700 | Y$_2$O$_3$, SiC, Y$_8$Si$_4$N$_4$O$_{14}$, Y$_2$Si$_3$O$_3$N$_4$ | 1.5 | 4.76 | 0.0 | 320 | 1.8 | 10$^{16}$ |
| Example 6 | 85 | 10 | 5 | 0 | 1800 | Y$_2$O$_3$, SiC, Y$_8$Si$_4$N$_4$O$_{14}$, Y$_2$Si$_3$O$_3$N$_4$ | 1.5 | 4.76 | 0.0 | 300 | 1.8 | 10$^{16}$ |
| Example 7 | 85 | 10 | 5 | 0 | 1850 | Y$_2$O$_3$, SiC, Y$_8$Si$_4$N$_4$O$_{14}$, Y$_2$Si$_3$O$_3$N$_4$ | 2.0 | 4.76 | 0.0 | 280 | 1.7 | 10$^{16}$ |
| Example 8 | 82.5 | 10 | 7.5 | 0 | 1700 | Y$_2$O$_3$, SiC, Y$_8$Si$_4$N$_4$O$_{14}$, Y$_2$Si$_3$O$_3$N$_4$ | 1.8 | 4.72 | 0.0 | 330 | 1.9 | 10$^{16}$ |
| Example 9 | 82.5 | 10 | 7.5 | 0 | 1800 | Y$_2$O$_3$, SiC, Y$_8$Si$_4$N$_4$O$_{14}$, Y$_2$Si$_3$O$_3$N$_4$ | 1.8 | 4.72 | 0.0 | 320 | 1.8 | 10$^{16}$ |
| Example 10 | 87.5 | 7.5 | 5 | 0 | 1800 | Y$_2$O$_3$, SiC, Y$_8$Si$_4$N$_4$O$_{14}$, Y$_2$Si$_3$O$_3$N$_4$ | 1.6 | 4.80 | 0.0 | 290 | 1.7 | 10$^{16}$ |
| Example 11 | 90 | 5 | 5 | 0 | 1800 | Y$_2$O$_3$, SiC, Y$_8$Si$_4$N$_4$O$_{14}$, Y$_2$Si$_3$O$_3$N$_4$ | 1.7 | 4.84 | 0.0 | 270 | 1.6 | 10$^{16}$ |
| Example 12 | 88 | 10 | 1 | 1 | 1800 | Y$_2$O$_3$, SiC, Y$_8$Si$_4$N$_4$O$_{14}$ | 1.3 | 4.82 | 0.0 | 300 | 1.7 | 10$^{16}$ |
| Example 13 | 86 | 10 | 3 | 1 | 1600 | Y$_2$O$_3$, SiC, Y$_8$Si$_4$N$_4$O$_{14}$ | 1.0 | 4.78 | 0.0 | 350 | 1.9 | 10$^{16}$ |
| Example 14 | 86 | 10 | 3 | 1 | 1700 | Y$_2$O$_3$, SiC, Y$_8$Si$_4$N$_4$O$_{14}$ | 1.2 | 4.78 | 0.0 | 330 | 1.9 | 10$^{16}$ |
| Example 15 | 86 | 10 | 3 | 1 | 1800 | Y$_2$O$_3$, SiC, Y$_8$Si$_4$N$_4$O$_{14}$ | 1.5 | 4.78 | 0.0 | 310 | 1.8 | 10$^{16}$ |
| Example 16 | 86 | 10 | 3 | 1 | 1850 | Y$_2$O$_3$, SiC, Y$_8$Si$_4$N$_4$O$_{14}$ | 2.1 | 4.78 | 0.0 | 290 | 1.7 | 10$^{16}$ |
| Example 17 | 84 | 10 | 5 | 1 | 1800 | Y$_2$O$_3$, SiC, Y$_8$Si$_4$N$_4$O$_{14}$, Y$_2$Si$_3$O$_3$N$_4$ | 1.7 | 4.76 | 0.0 | 320 | 1.8 | 10$^{16}$ |
| Example 18 | 81.5 | 10 | 7.5 | 1 | 1800 | Y$_2$O$_3$, SiC, Y$_8$Si$_4$N$_4$O$_{14}$, Y$_2$Si$_3$O$_3$N$_4$ | 1.9 | 4.72 | 0.0 | 330 | 1.9 | 10$^{16}$ |
| Example 19 | 86.5 | 7.5 | 5 | 1 | 1800 | Y$_2$O$_3$, SiC, Y$_8$Si$_4$N$_4$O$_{14}$, Y$_2$Si$_3$O$_3$N$_4$ | 1.8 | 4.80 | 0.0 | 280 | 1.7 | 10$^{16}$ |
| Example 20 | 89 | 5 | 5 | 1 | 1800 | Y$_2$O$_3$, SiC, Y$_8$Si$_4$N$_4$O$_{14}$, Y$_2$Si$_3$O$_3$N$_4$ | 1.9 | 4.84 | 0.0 | 280 | 1.6 | 10$^{16}$ |
| Example 21 | 84 | 10 | 3 | 3 | 1550 | Y$_2$O$_3$, SiC, Y$_8$Si$_4$N$_4$O$_{14}$ | 1.0 | 4.84 | 0.0 | 350 | 1.9 | 10$^{16}$ |
| Example 22 | 100 | 0 | 0 | 0 | 1600 | Y$_2$O$_3$ | — | 5.03 | 0.0 | 180 | 1.1 | 10$^{16}$ |
| Example 23 | 100 | 0 | 0 | 0 | 1700 | Y$_2$O$_3$ | — | 5.03 | 0.0 | 160 | 1.1 | 5 × 10$^{15}$ |
| Example 24 | 100 | 0 | 0 | 0 | 1800 | Y$_2$O$_3$ | — | 5.03 | 0.0 | 140 | 1.1 | 9 × 10$^{14}$ |
| Example 25 | 90 | 10 | 0 | 0 | 1600 | Y$_2$O$_3$, SiC, Y$_2$SiO$_5$ | 1.2 | 4.56 | 0.3 | 160 | 1.4 | 10$^{16}$ |
| Example 26 | 90 | 10 | 0 | 0 | 1700 | Y$_2$O$_3$, SiC, Y$_2$SiO$_5$ | 1.5 | 4.81 | 0.1 | 190 | 1.5 | 10$^{16}$ |
| Example 27 | 90 | 10 | 0 | 0 | 1800 | Y$_2$O$_3$, SiC, Y$_2$SiO$_5$ | 1.7 | 4.84 | 0.0 | 250 | 1.5 | 10$^{16}$ |
| Example 28 | 89 | 10 | 0 | 1 | 1600 | Y$_2$O$_3$, SiC, Y$_2$SiO$_5$ | 1.3 | 4.84 | 0.0 | 270 | 1.6 | 10$^{16}$ |
| Example 29 | 89 | 10 | 0 | 1 | 1700 | Y$_2$O$_3$, SiC, Y$_2$SiO$_5$ | 1.6 | 4.84 | 0.0 | 250 | 1.6 | 10$^{16}$ |
| Example 30 | 89 | 10 | 0 | 1 | 1800 | Y$_2$O$_3$, SiC, Y$_2$SiO$_5$ | 1.8 | 4.84 | 0.0 | 240 | 1.5 | 10$^{16}$ |
| Example 31 | 91.5 | 0 | 7.5 | 1 | 1800 | Y$_2$O$_3$, Y$_8$Si$_4$N$_4$O$_{14}$ | — | 4.86 | 0.0 | 170 | 1.4 | 10$^{16}$ |

TABLE 2

| Sample | Composition (Vol %) Y$_2$O$_3$ | SiC | Si$_3$N$_4$ | F | Firing temperature °C. | Constituent phases | Average SiC particle diameter μm | Density g/cm$^3$ | Open pores % | Strength MPa | Fracture toughness MPA·m$^{1/2}$ | Volume resistivity Ω cm |
|---|---|---|---|---|---|---|---|---|---|---|---|---|
| Example 32 | 86 | 10 | 3 | 1:CaF$_2$ | 1650 | Y$_2$O$_3$, SiC, Y$_8$Si$_4$N$_4$O$_{14}$ | 1.2 | 4.76 | 0.0 | 250 | 1.9 | 10$^{16}$ |
| Example 33 | 81.8 | 13 | 3.9 | 1.3:CaF$_2$ | 1650 | Y$_2$O$_3$, SiC, Y$_8$Si$_4$N$_4$O$_{14}$ | 1.2 | 4.62 | 0.0 | 280 | 1.9 | 10$^{16}$ |
| Example 34 | 81.8 | 13 | 3.9 | 1.3:CaF$_2$ | 1700 | Y$_2$O$_3$, SiC, Y$_8$Si$_4$N$_4$O$_{14}$ | 1.3 | 4.68 | 0.0 | 310 | 2.0 | 10$^{16}$ |
| Example 35 | 86 | 10 | 3 | 1:MgF$_2$ | 1650 | Y$_2$O$_3$, SiC, Y$_8$Si$_4$N$_4$O$_{14}$ | 1.2 | 4.77 | 0.0 | 280 | 2.0 | 10$^{16}$ |
| Example 36 | 86 | 10 | 3 | 1:MgF$_2$ | 1700 | Y$_2$O$_3$, SiC, Y$_8$Si$_4$N$_4$O$_{14}$ | 1.3 | 4.77 | 0.0 | 290 | 2.0 | 10$^{16}$ |
| Example 37 | 86 | 10 | 3 | 1:AlF$_3$ | 1650 | Y$_2$O$_3$, SiC, Y$_8$Si$_4$N$_4$O$_{14}$, Al$_2$Y$_4$O$_9$ | 1.2 | 4.67 | 0.0 | 260 | 2.0 | 10$^{16}$ |

What is claimed is:

1. An yttrium oxide material comprising $Y_2O_3$, SiC, and a compound, the compound containing a rare-earth element (RE), Si, O, and N.

2. The yttrium oxide material according to claim 1, wherein the compound is $RE_8Si_4N_4O_{14}$ (RE denotes a rare-earth element).

3. The yttrium oxide material according to claim 1, wherein the RE is Y.

4. The yttrium oxide material according to claim 1, further comprising fluorine.

5. The yttrium oxide material according to claim 1, wherein the SiC has an average particle size of 4 μm or less.

6. The yttrium oxide material according to claim 1, wherein the yttrium oxide material has a four-point bending strength of at least 250 MPa.

7. The yttrium oxide material according to claim 1, wherein the yttrium oxide material has a fracture toughness of at least 1.5 $MPa·m^{1/2}$.

8. The yttrium oxide material according to claim 1, wherein the yttrium oxide material has a volume resistivity of at least $1 \times 10^{15}$ Ωcm at 20° C.

9. A member for use in a semiconductor manufacturing apparatus, comprising an yttrium oxide material according to claim 1.

10. A method for producing an yttrium oxide material, comprising the step of:
    firing a mixture of $Y_2O_3$, SiC, and inorganic particles at a temperature in the range of 1500° C. to 1850° C., the inorganic particles being converted into a compound that contains a rare-earth element (RE), Si, O, and N.

11. The method according to claim 10, wherein the inorganic particles comprise $Si_3N_4$ and $Y_2O_3$.

12. The method according to claim 10, the mixture further comprises at least one compound selected from the group consisting of $YF_3$, $MgF_2$, $CaF_2$, and $AlF_3$.

13. The method according to claim 10, wherein the firing step is performed at a temperature in the range of 1600° C. to 1700° C.

* * * * *